United States Patent [19]

Etoh et al.

[11] 4,187,112
[45] Feb. 5, 1980

[54] PHOTOSENSITIVE PLATE CONTAINING NITROGEN CONTAINING CONDENSATION TYPE POLYESTERS

[75] Inventors: Kuniomi Etoh; Masaru Nanpei; Morio Miyagi, all of Otsu, Japan

[73] Assignee: Toyobo Co., Ltd., Osaka, Japan

[21] Appl. No.: 843,850

[22] Filed: Oct. 20, 1977

Related U.S. Application Data

[63] Continuation of Ser. No. 693,178, Jun. 7, 1976, abandoned, which is a continuation of Ser. No. 525,107, Nov. 19, 1974, abandoned.

[30] Foreign Application Priority Data

Nov. 19, 1973 [JP] Japan .................... 48-130390

[51] Int. Cl.$^2$ ............... G03C 1/68; G03C 1/78; G03C 5/00
[52] U.S. Cl. ..................... 430/285; 430/288; 430/306; 430/908; 204/159.19
[58] Field of Search .............. 96/115 P, 115 R, 35.1, 96/87 R; 204/159.19; 260/75 N, 861, 868

[56] References Cited

U.S. PATENT DOCUMENTS 3,954,902 5/1976 Vaginay ..................... 260/75 N

FOREIGN PATENT DOCUMENTS 613952 2/1961 Canada ..................... 96/115 P

*Primary Examiner*—Jack P. Brammer
*Attorney, Agent, or Firm*—Birch, Stewart, Kolasch & Birch

[57] ABSTRACT

A photosensitive resin composition which comprises a polyester having a nitrogen atom in the ammonium salt form in the main or side chain representable by the formula:

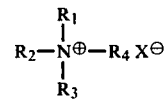

wherein $R_1$, $R_2$, $R_3$ and $R_4$ are each a hydrogen atom or a substituted or unsubstituted hydrocarbon group, at least one of $R_1$ to $R_4$ representing a polymeric chain, and X is an anion to be paired with the ammonium ion, a photopolymerizable unsaturated monomer and a photosensitizer.

13 Claims, No Drawings

PHOTOSENSITIVE PLATE CONTAINING NITROGEN CONTAINING CONDENSATION TYPE POLYESTERS

This application is a continuation, of copending application Ser. No. 693,178, filed on June 7, 1976 now abandoned. (Monday) which is a continuation of application Ser. No. 525,107 filed Nov. 19, 1974, now abandoned.

The present invention relates to a photosensitive resin composition.

It is known that a relief printing plate can be prepared by exposing a photosensitive material comprising a layer of a photosensitive resin composition (hereinafter referred to as "photosensitive layer") and a support therefor through a negative or positive film having a transparent image to an active light so as to cure and make insoluble the photosensitive resin composition at the exposed part and then removing off the photosensitive resin composition at the non-exposed part with a suitable solvent. Such photosensitive resin composition comprises usually a photopolymerizable unsaturated monomer, a polymer which is soluble in a suitable solvent and, when photopolymerized with the said monomer, becomes insoluble, a photosensitizer and a thermal polymerization inhibitor. Namely, the said photosensitive resin composition, especially the said polymer, should be soluble in a suitable solvent before exposure but becomes insoluble in the same solvent after exposure. Further, the said polymer should show a large mechanical strength and not be swollen by organic solvents after photopolymerization with the photopolymerizable unsaturated monomer. As such polymer, there have been proposed some copolymerized polyesters, which are soluble in aqueous alkalis (Japanese Patent Publications Nos. 19125/1968 and 14733/1972, etc.). As is well known, however, the use of aqueous alkalis is accompanied with dangers on operation and may cause corrosion of apparatus. In addition, a problem of pollution often arises due to the pH values of the waste solutions.

As the result of extensive studies, there has now been provided a photosensitive resin composition which is readily dissolved in water or a dilute aqueous acid before photopolymerization and which becomes insoluble therein, showing an excellent mechanical strength after photopolymerization.

The photosensitive resin composition of the present invention comprises a polyester having a nitrogen atom in the ammonium salt form in the main or side chain, a photopolymerizable unsaturated monomer and a photosensitizer.

The polyester having a nitrogen atom in the ammonium salt form in the main or side chain to be used in the invention is representable by the formula:

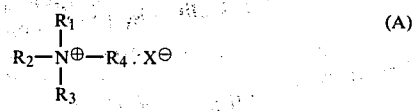

wherein $R_1$, $R_2$, $R_3$ and $R_4$ are each a hydrogen atom or a substituted or unsubstituted hydrocarbon group, at least one of $R_1$ to $R_4$ representing a polymeric chain, and X is an anion to be paired with the ammonium ion.

The polyester (A) may be prepared by treating a polyester having a basic nitrogen atom of the formula:

$$R_2-\underset{\underset{R_3}{|}}{\overset{\overset{R_1}{|}}{N}}-R_3 \quad (B)$$

wherein $R_1$, $R_2$ and $R_3$ are each a hydrogen atom or a substituted or unsubstituted hydrocarbon group, at least one of $R_1$ to $R_3$ representing a polymeric chain, with a protonic acid, a quaternizing agent or an epoxy compound and a protonic acid.

The polyester (B), which has a basic nitrogen atom in the main chain, may be prepared, for instance, by the use of at least one of the compounds represented by either one of the formulae:

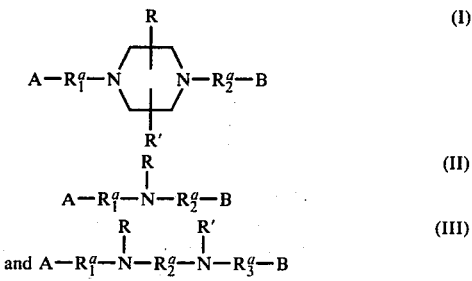

wherein R and R' are each a hydrogen atom or a hydrocarbon group (preferably having 1 to 10 carbon atoms), $R_1^a$, $R_2^a$ and $R_3^a$ are each an alkylene group (preferably having 1 to 15 carbon atoms) and A and B are each —OH, —COOH or —COOR" (R" being a hydrocarbon group (preferably having 1 to 10 carbon atoms)) as the starting monomer.

As the monomer (I), there may be exemplified dicarboxylic acids (e.g. N,N'-bis(carboxymethyl)piperazine, N,N'-bis(carboxymethyl)methylpiperazine, N,N'-bis(-carboxymethyl)-2,6-dimethylpiperazine, N,N'-bis(2-carboxyethyl)piperzine, N,N'-bis(3-carboxypropyl)piperazine, N-(2-carboxyethyl)-N'-(carboxymethyl)piperazine) and their reactive derivatives such as lower alkyl esters and acid halides, glycols (e.g. N,N'-bis(hydroxymethyl)piperazine, N,N'-bis(hydroxymethyl)methylpiperazine, N,N'-bis(2-hydroxypropyl)piperazine, N,N'-bis(2-hydroxypropyl)-2,5-dimethylpiperazine, N,N'-bis(2-hydroxyethyl)-2,5-dimethylpiperazine, N,N'-bis(2-hydroxy-2-methylpropyl)piperazine, N,N'-bis(3-methyl-2-hydroxy-2-methylpropyl)piperazine, N,N'-bis(2-hydroxycycloheptyl)piperzine, N,N'-bis(2-methyl-2-hydroxynonyl)piperazine, N,N'-bis(2-hydroxy-3-methoxypropyl)piperazine, N,N'-bis(3-phenyl-2-hydroxypropyl)piperazine, N,N'-bis(3-phenoxy-2-hydroxypropyl)piperazine), etc.

As the monomer (II), there may be exemplified dicarboxylic acids (e.g. N,N-bis(carboxymethyl)methylamine, N,N-bis(2-carboxyethyl)cyclohexylamine, N,N-bis(2-carboxyethyl)methylamine, N,N-bis(2-carboxyethyl)isopropylamine, N-carboxymethyl-N-(2-carboxyethyl)methylamine) and their reactive derivatives such as lower alkyl esters and acid halides, glycols (e.g. N,N-bis(2-hydroxyethyl)phenylamine, N,N-bis(2-hydroxyethyl)methylamine, N,N-bis(2-hydroxyethyl)cyclohexylamine, N,N-bis(2-hydroxypropyl)amine, N,N-bis(2-hydroxypropyl)methylamine, N,N-bis(2-hydroxypropyl)isopropylamine), etc.

As the monomer (III), there may be exemplified dicarboxylic acids (e.g. N,N'-dimethyl-N,N'-bis(carboxymethyl)ethylenediamine, N,N'-dimethyl-N,N'-bis(2- carboxyethyl)ethylenediamine, N,N'-dimethyl-N,N'-bis(3-carboxypropyl)hexamethylenediamine) and their reactive derivatives such as lower alkyl esters and acid halides, glycols (e.g. N,N'-dimethyl-N,N'-bis(2-hydroxyethyl)ethylenediamine, N,N'-dicyclohexyl-N,N'-bis(2-hydroxyethyl)hexamethylenediamine, N,N'-diethyl-N,N'-bis(2-hydroxypropyl)ethylenediamine, N,N'-dibutyl-N,N'-bis(2-hydroxypropyl)pentamethylenediamine, N,N'-dimethyl-N,N'-bis(2-hydroxyethyl)-2,4,4-trimethylhexamethylenediamine), etc.

The polyester (B), which has a basic nitrogen atom in the side chain, may be prepared, for instance, by the use of at least one of the compounds represented by the formula:

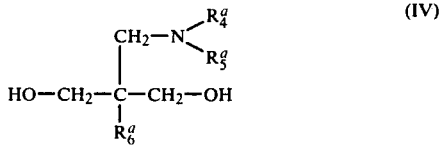

wherein $R_4^a$ and $R_5^a$ are each a hydrocarbon group (preferably having 1 to 10 carbon atoms) or they may be linked together to form a ring and $R_6^a$ is a lower alkyl group (preferably having 1 to 3 carbon atoms) or a group of the formula:

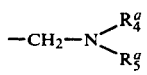

(wherein $R_4^a$ and $R_5^a$ are each as defined above) as the starting monomer.

As the monomer (IV), there may be exemplified glycols (e.g. 2-methyl-2-(N,N-dimethylaminomethyl)-1,3-propanediol, 2-methyl-2-(N,N-diethylaminomethyl)-1,3-propanediol, 2-methyl-2-(N,N-di-n-propylaminomethyl)-1,3-propanediol, 2-methyl-2-(N,N-diisopropylaminomethyl)-1,3-propanediol, 2-methyl-2-(N,N-di-n-butylaminomethyl)-1,3-propanediol, 2-methyl-2-(N,N-diisobutylaminomethyl)-1,3-propanediol, 2-methyl-2-piperidinomethyl-1,3-propanediol, 2,2-bis(N,N-dimethylaminomethyl)-1,3-propanediol, 2,2-bis(N,N-diisopropylaminomethyl)-1,3-propanediol), etc.

These monomers may be used solely or in combination.

In addition to the monomers (I) to (IV), aliphatic and/or aromatic dicarboxylic acids, glycols and hydroxy acids as conventionally employed in preparation of polyesters may be also used as the monomeric components for production of the polyester (B).

Examples of the dicarboxylic acids are saturated aliphatic dicarboxylic acids (e.g. succinic acid, adipic acid, azelaic acid, sebacic acid, dodecanedicarboxylic acid, cyclohexanedicarboxylic acid), aromatic dicarboxylic acids (e.g. terephthalic acid, isophthalic acid), α,β-unsaturated dicarboxylic acids (e.g. fumaric acid, maleic acid, itaconic acid), etc. Their reactive derivatives such as lower alkyl esters, acid halides and acid anhydrides are also utilizable. Examples of the glycols are ethylene glycol, trimethylene glycol, tetramethylene glycol, decamethylene glycol, diethylene glycol, neopentyl glycol, polyethylene glycol (preferably having a molecular weight of 200 to 1000), bis(4-hydroxyphenyl)alkanes (e.g. bis(4-hydroxyphenyl)methane, 1,1-bis(4-hydroxyphenyl)ethane, 1,1-bis(4-hydroxyphenyl)butane, 1,1-bis(4-hydroxyphenyl)isobutane, 1,1-bis(4-hydroxyphenyl)cyclohexane, 2,2-bis(4-hydroxyphenyl)propane, 2,2-bis(4-hydroxyphenyl)butane) and their alkylene oxide adducts, cycloalkanes, metaxylylene glycol, paraxylylene glycol, etc. Examples of the hydroxy acids are glycolic acid, hydroxyacrylic acid, etc.

The polymerization of these monomers for obtaining the polyester (B) may be effected in any appropriate manner as usually adopted for preparation of thermoplastic polyesters such as polyethylene terephthalate. The amount of the monomeric component containing a basic nitrogen atom such as the monomers (I) to (IV) may be usually 10 to 100 mol %, preferably 50 to 100 mol %, of the total amount of the monomeric components of the polyester.

The thus prepared polyester (B) is treated with a protonic acid, a quaternizing agent or a protonic acid and an epoxy compound to obtain the polyester (A). The treatment may be effected, for instance, by dissolving the polyester (B) together with a protonic acid, a quaternizing agent or a protonic acid and an epoxy compound (preferably an unsaturated epoxy compound) in a suitable solvent at an appropriate temperature, by melting a mixture of the polyester (B) together with the said reagent(s), or by contacting the polyester (B) with the said reagent(s) in a gaseous state. Alternatively, such treatment may be carried out on or after admixing the polyester (B) with a photopolymerizable unsaturated monomer, a photosensitizer and/or a thermal polymerization inhibitor.

As the protonic acid, there may be used an inorganic acid (e.g. hydrochloric acid, sulfuric acid) or an organic acid (e.g. formic acid, acetic acid, chloroacetic acid, maleic acid, phthalic acid, adipic acid, acrylic acid). Protonic acids containing a polymerizable unsaturated bond in the molecule such as acrylic acid, maleic acid or cinnamic acid can also served as a cross linking agent to promote the curing.

As the quaternizing agent, there may be exemplified alkyl halides (e.g. methyl chloride, ethyl chloride, methyl bromide, methyl iodide, ethyl chloride, ethyl bromide, lauryl chloride), aralkyl halides (e.g. benzyl chloride), 1,2-dichloroxylene, 1,3-dichloroxylene, ethylenechlorohydrin, 2-chloroethyl acrylate, 2-chloroethyl methacrylate, 2,3-dibromopropyl acrylate, 2,3-dibromopropyl methacrylate, 3-chloro-2-hydroxypropyl acrylate, 3-chloro-2-hydroxypropyl methacrylate, dialkyl sulfates, alkyl p-toluenesulfonates, etc.

As the epoxy compound, there may be preferably used the unsaturated one represented by the formula:

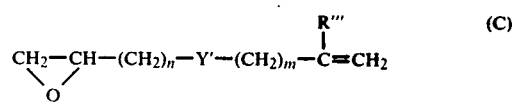

wherein R''' is a hydrogen atom or a lower alkyl group, Y' is —OOC—, —HNCO—, —O—, —SO₃— or —HNCONH—, n is an integer of 0 to 3 and m is 0 or 1. Specific examples are glycidyl acrylate, glycidyl methacrylate, N-glycidyl acrylamide, N-glycidyl methacrylamide, vinyl glycidyl ether, allyl glycidyl ether, glycidyl vinylsulfonate, N-isopropenylglycidylurethane, etc. The amount of the epoxy compound may be 0.02 to 10 mol, preferably 0.05 to 5 mol, to 1 mol of the basic nitrogen atom in the polyester (B).

The amounts of the protonic acid and the quaternizing agent may be appropriately decided depending on the amount of the basic nitrogen atom in the polyester (B), the solubility of the resultant polyester (A) to be desired and the like.

The thus obtained polyester (A) contains a nitrogen atom in the ammonium salt form in the main or side chain and is readily soluble in water or a dilute aqueous acid. In particular, a large solubility in water is obtained when at least $1 \times 10^{-3}$ mol of the nitrogen atom in the ammonium salt form is present in 1 g of the polyester (A).

As the photopolymerizable unsaturated monomer to be used in the photosensitive resin composition of the invention, there may be exemplified monomers containing one double bond (e.g. acrylic acid, methacrylic acid, methyl acrylate, methyl methacrylate, benzyl acrylate, tribromophenyl acrylate, cyclohexyl acrylate, 2-hydroxypropyl acrylate, acrylamide, methacrylamide, N-methylolacrylamide, n-butoxymethylacrylamide, isobutoxymethylacrylamide, N-tert-butylacrylamide, sodium acrylate, ammonium acrylate, acrylonitrile, styrene, sodium styrenesulfonate, vinyl pyridine) and monomers containing two or more double bonds (e.g. allyl methacrylate, ethylene glycol diacrylate, ethylene glycol dimethacrylate, 1,3-propanediol diacrylate, 1,3-propanediol dimethacrylate, 1,4-butanediol diacrylate, 1,4-butanediol dimethacrylate, 1,6-hexanediol diacrylate, 1,6-hexanediol dimethacrylate, trimethylolpropane triacrylate, trimethylolpropane trimethacrylate, tetramethylolmethane triacrylate, triacryloyloxyethyl phosphate, methylenebisacrylamide, ethylenebisacrylamide, propylenebisacrylamide, butylenebisacrylamide, methylenebismethacrylamide, ethylenebismethacrylamide, propylenebismethacrylamide). Among them, the use of the monomer(s) showing a good compatibility with the polyester (A) or the polyester (B) is preferred. They may be used solely or in combination. The sole use of the monomer having at least two double bonds or the combined use of the monomers having at least one double bond is particularly favorable.

The amount of the monomer may be 5 to 150% by weight, preferably 10 to 100% by weight, with respect to the polyester (A) in the photosensitive resin composition. When the amount is smaller than 5% by weight, the insolubility at the exposed part is insufficient. When the amount is larger than 150% by weight, the mechanical strength of the photosensitive layer after exposure is deteriorated.

As the photosensitizer, there may be employed any one which can promote the polymerization of the said monomer within the matrix of the polymer. Specific examples are anthraquinones (e.g. 9,10-anthraquinone, 1-chloro anthraquinone, 2-chloroanthraquinone), benzophenones (e.g. benzophenone, p-aminobenzophenone, p-chlorobenzophenone), benzoins (e.g. benzoin, benzoin methyl ether, benzoin ethyl ether, α-methylbenzoin), benzyls, etc. The amount of the photosensitizer may be 0.01 to 5% by weight, preferably 0.1 to 2% by weight, to the total amount of the polyester (A) and the photopolymerizable unsaturated monomer.

As the thermal polymerization inhibitor, there may be employed any one which can prevent thermal polymerization of the photopolymerizable unsaturated monomer during preparation, molding or processing of the photosensitive resin composition under heating or dark reaction of the photosensitive resin composition on storage. Specific examples are hydroquinones (e.g. hydroquinone, mono-tert-butylhydroquinone, 2,5-di-tert-butylhydroquinone), benzoquinones (e.g. benzoquinone, 2,5-di-tert-butyl-p-benzoquinone), catechols (e.g. catechol, p-tert-butylcatechol), picric acids, etc. The amount of the thermal polymerization inhibitor may be 0 to 2% by weight, preferably 0.05 to 0.5% by weight, to the total amount of the polyester (A) and the photopolymerizable unsaturated monomer.

The photosensitive resin composition can be prepared by admixing uniformly the polyester (A), the photopolymerizable unsaturated monomer, the photosensitizer and the thermal polymerization inhibitor, or by admixing uniformly the polyester (B), the protonic acid, the quaternizing agent or the protonic acid and the epoxy compound, the photopolymerizable unsaturated monomer, the photosensitizer and the thermal polymerization inhibitor. The admixing may be effected, for instance, by dissolving the materials in a suitable solvent (e.g. water, methanol, ethanol, isopropanol, chloroform, carbon tetrachloride, toluene, xylene) and removing the solvent by evaporation, or by mixing the materials in a melted state under such conditions as not to cause thermal polymerization of the resultant photosensitive resin composition to make the same insoluble.

The photosensitive resin composition of the invention is readily soluble in mere water or a dilute aqueous acid. The time required for complete dissolution is equal to or shorter than that in case of dissolving any polymer containing no nitrogen atom in the main or side chain in an aqueous alkali.

When the photosensitive resin composition of the invention is irradiated with active light from various light sources such as an ultrahigh pressure mercury lamp, high pressure mercury lamp, low pressure mercury lamp, xenon lamp and carbon arc lamp, the photochemical reaction of the photopolymerizable unsaturated monomer progresses within the matrix of the polymer to make the said composition insoluble to water or a dilute aqueous acid. The photosensitive resin composition thus irradiated with light is hardly influenced by atmospheric moisture or by contact with hydrous substances and is excellent in physical strength.

The photosensitive resin composition of the invention may be employed as a photosensitive material in a simple sheet form or in a layer form with a support. The preparation of a sheet may be effected, for example, by molding the photosensitive resin composition by heat pressing, casting or melt extrusion to obtain a desired thickness. A laminated product may be prepared, for example, by sticking the photosensitive resin composition in a sheet form on a support with or without an adhesive. As the support, there may be used any suitable one such as steel, aluminum, iron, glass or plastic film.

For exposure, the photosensitive layer of the photosensitive material is closely contacted with a negative or positive film having a transparent image and is subjected to irradiation with an active light. The thus irradiated material is immersed into water or a dilute aqueous acid to remove the non-exposed part and then dried whereby a relief printing plate having an image with a distinct contour can be obtained.

The photosensitive material can be advantageously utilized not only as a printing material but also in various fields of industry such as printing, decoration, construction materials and electric parts.

Practical and presently preferred embodiments of the invention are illustratively shown in the following Examples wherein parts and % are by weight unless otherwise indicated. The reduced viscosity is determined at 30° C. with a polymer concentration of 400 mg/100 ml in a mixture of phenol and tetrachloroethane (6:4). The degree of gelation is determined by extracting the specimen after exposure with methanol by the aid of a Soxhlet's extractor for 24 hours, weighing the specimen after the extraction and making the calculation according to the following equation:

$$\text{Degree of gelation} = \frac{\text{Weight of specimen after extraction (g)}}{\text{Weight of specimen before extraction (g)}} \times 100$$

EXAMPLE 1

In a reactor, dimethyl terephthalate (1 mol), 2-methyl-2-(N,N-dimethylaminomethyl)-1,3-propanediol (2.5 mol) and zinc acetate (0.1% to the dimethyl terephthalate) are charged, and the contents are heated at 200° C. for 60 minuminutes while distilling out the by-produced methanol. Then, the temperature is elevated up to 218° C., and the reaction is continued for 60 minutes. The temperature is further elevated up to 255° C., and the pressure is gradually reduced to 0.03 mmHg in 30 minutes. The reaction is continued for 3 hours under these conditions while distilling out the excess of the glycol whereby a polymer having a basic nitrogen atom in the side chain is obtained as a white solid. Softening point, 86°–95° C. Reduced viscosity, 0.083.

The thus obtained polymer (100 parts), methacrylic acid (28 parts), ethylene glycol dimethacrylate (50 parts), methacrylamide (10 parts), benzoin (2 parts) and hydroquinone (0.05 part) are dissolved in chloroform (300 parts). The resultant viscous solution is poured on the surface of a Teflon plate and allowed to stand so as to evaporate the chloroform whereby a photosensitive resin film having a thickness of about 0.8 mm is obtained. The hardness of the thus obtained film is 38 when determined by an ASTM Shore D hardness tester.

The photosensitive resin film is attached to the surface of a polyethylene terephthalate film with a polyester adhesive ("Toyobo Pyron" manufactured by Toyobo Co., Ltd.), and a negative film of letters is closely contacted on the photosensitive resin layer. Then, exposure is effected by irradiation with a high pressure mercury lamp (1 KW) for 5 minutes from a distance of 10 cm. The irradiated product is developed in a water stream of pH 3.4 at 30° C. under a pressure of 1 Kg/cm² whereby a distance relief printing plate of letters of about 0.7 mm in depth and 60 to 70° in shoulder angle is obtained. The Shore D hardness of the relief part is 67 to 70, and the printability is excellent.

EXAMPLE 2

In a reactor, dimethyl terephthalate (100 parts), N,N'-bis(2-hydroxypropyl)piperazine (223 parts), zinc acetate (0.06 part) and antimony trioxide (0.03 part) are charged, and the contents are heated at 200° C. for 60 minutes while distilling out the produced methanol. Then, the temperature is elevated up to 255° C., and the pressure is gradually reduced to 0.03 mmHg in 30 minutes. The reaction is continued for 3 hours under these conditions while distilling out the excess of the glycol whereby a polymer having a basic nitrogen atom in the main chain is obtained as a yellowish white solid. M.P. 193° C. Reduced viscosity, 0.4.

To water (500 parts), the above obtained polymer (100 parts), acrylic acid (20 parts), ethylene glycol dimethacrylate (30 parts), benzoin (2 parts) and anthraquinone (2 parts) are added, and the mixture is stirred at 40° C. for about 1 hour to make a solution. Then, the temperature is elevated up to 70° C., and water is removed off under reduced pressure to obtain a photosensitive resin composition, which is rolled on the surface of a polyethylene terephthalate film under heating to give a photosensitive resin plate of 1 mm in thickness.

On the photosensitive layer of the plate, a negative film of letters is placed, and exposure is effected by irradiation with a high pressure mercury lamp (1 KW) for 5 minutes from a distance of 10 cm. The irradiated product is developed in a water stream at 35° C. for about 5 minutes under a pressure of 3 kg/cm² whereby a distinct relief printing plate of letters of about 1 mm in depth and 70 to 80° in shoulder angle is obtained. The Shore D hardness of the relief part is 70 to 75, and the printability is excellent.

What is claimed is:

1. A water or dilute aqueous acid-developable photosensitive plate for preparation of a printing plate and containing a layer of a water-soluble photosensitive resin composition which consists essentially of a condensation type polyester having a nitrogen atom in the ammonium salt form in the main or a side chain thereof, said polyester containing at least $1 \times 10^{-3}$ mole of the nitrogen atom in the ammonium salt form per 1 gram, from 5 to 150% by weight, with respect to said polyester of a photopolymerizable unsaturated monomer and from 0.01 to 5% by weight with respect to the total amount of said polyester and the photopolymerizable unsaturated monomer of a photosensitizer, said polyester having the formula:

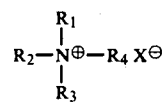

wherein $R_1$, $R_2$, $R_3$ and $R_4$ are each a hydrogen atom, a substituted or unsubstituted hydrocarbon group or a condensation type polyester chain, at least one of $R_1$ to $R_4$ representing said condensation type polyester chain, and X is an anion paired with the ammonium ion.

2. The printing plate according to claim 1, wherein the polyester is prepared by treating a nitrogen-containing compound of the formula:

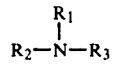

wherein $R_1$, $R_2$ and $R_3$ are each a hydrogen atom, a substituted or unsubstituted hydrocarbon group or a condensation type polyester chain, at least one of $R_1$ to $R_3$ representing said polyester chain, with a protonic acid, a quaternizing agent or an epoxy compound and a protonic acid.

3. The printing plate according to claim 2, wherein the nitrogen-containing polyester is prepared by the use of at least one of the compounds represented by either one of the formulae:

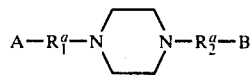

-continued

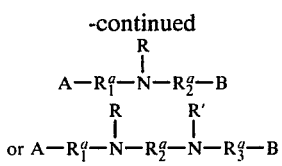

wherein R and R' are each a hydrogen atom or a hydrocarbon group, $R_1^a$, $R_2^a$ and $R_3^a$ are each an alkylene group and A and B are each —OH, —COOH or —COOR", R" being a hydrocarbon group, as the starting monomer.

4. The printing plate according to claim 2, wherein the nitrogen-containing polyester is prepared by the use of at least one of the compounds represented by the formula:

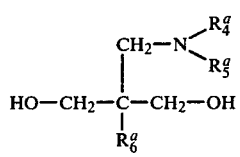

wherein $R_4^a$ and $R_5^a$ are each a hydrocarbon group or they may be linked together to form a ring and $R_6^a$ is a lower alkyl group or a group of the formula:

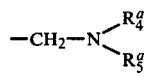

wherein $R_4^a$ and $R_5^a$ are each as defined above, as the starting monomer.

5. The printing plate according to claim 3, wherein the amount of the monomeric component containing a basic nitrogen atom is from 10 to 100 mole % of the total amount of the monomeric components of the nitrogen-containing polyester.

6. The printing plate according to claim 1, which further comprises a thermal polymerization inhibitor in an amount of not more than 2% by weight with respect to the total amount of said polyester and the photopolymerizable unsaturated monomer.

7. The printing plate according to claim 1, wherein said printing plate is a film of said photosensitive resin composition.

8. The printing plate according to claim 7, which further comprises a support for said film.

9. The printing plate according to claim 2, wherein the nitrogen-containing polyester is prepared by the use of 2-methyl-2-(N,N-dimethylaminomethyl)-1,3-propanediol as the starting material.

10. The printing plate according to claim 1, wherein the nitrogen-containing polyester is prepared by treating a polyester, which is obtained by polymerizing 2-methyl-2-(N,N-dimethylaminomethyl)-1,3-propanediol with dimethyl terephthalate, with methacrylic acid.

11. The printing plate according to claim 4, wherein the amount of the monomeric component containing a basic nitrogen atom is from 10 to 100 mol % of the total amount of the monomeric components of the nitrogen-containing polyester.

12. The printing plate according to claim 2, wherein the nitrogen-containing polyester is prepared by the use of N,N'-bis(2-hydrosypropyl)-piperazine as the starting material.

13. The printing plate according to claim 1, wherein the nitrogen-containing polyester is prepared by treating a polyester which is obtained by polymerizing N,N'-bis(2,hydroxypropyl)piperazine with dimethyl terephthalate, with acrylic acid.

* * * * *